United States Patent
Kwon et al.

(10) Patent No.: US 9,653,397 B2
(45) Date of Patent: May 16, 2017

(54) SEMICONDUCTOR PACKAGE AND METHOD OF MANUFACTURING THE SAME

(71) Applicant: NEPES CO., LTD., Chungcheongbuk-do (KR)

(72) Inventors: Yong-Tae Kwon, Chungcheongbuk-do (KR); Jun-Kyu Lee, Chungcheongbuk-do (KR)

(73) Assignee: NEPES CO., LTD., Chungcheongbuk-Do (KR)

( * ) Notice: Subject to any disclaimer, the term of this patent is extended or adjusted under 35 U.S.C. 154(b) by 0 days.

(21) Appl. No.: 14/866,725

(22) Filed: Sep. 25, 2015

(65) Prior Publication Data

US 2016/0099210 A1    Apr. 7, 2016

(30) Foreign Application Priority Data

Oct. 1, 2014    (KR) .................. 10-2014-0132544

(51) Int. Cl.
*H01L 23/528*    (2006.01)
*H01L 21/768*    (2006.01)
(Continued)

(52) U.S. Cl.
CPC .......... *H01L 23/528* (2013.01); *H01L 21/486* (2013.01); *H01L 21/76829* (2013.01);
(Continued)

(58) Field of Classification Search
CPC ............... H01L 23/538; H01L 23/5384; H01L 23/5386; H01L 23/5389; H01L 23/52;
(Continued)

(56) References Cited

U.S. PATENT DOCUMENTS

2005/0046002 A1*    3/2005    Lee ................... H01L 21/76898
                                                       257/678
2005/0064707 A1*    3/2005    Sinha ................ H01L 21/76898
                                                       438/667

(Continued)

FOREIGN PATENT DOCUMENTS

JP    2001-237337    8/2001
KR    10-2008-0064088    7/2008

(Continued)

OTHER PUBLICATIONS

Office Action dated Jan. 2, 2016 for Korean Patent Application No. 10-2014-0132544 and its English machine translation provided by Google Translate.

(Continued)

*Primary Examiner* — Eduardo A Rodela
(74) *Attorney, Agent, or Firm* — Ladas & Parry, LLP

(57) ABSTRACT

Disclosed herein are a semiconductor package and a method of manufacturing the same, which allows a conductive path to be provided to connect upper and lower portions of the semiconductor package. A semiconductor package according to the present invention includes a semiconductor chip, a substrate including an accommodating portion to accommodate the semiconductor chip, a sealing material configured to mold the semiconductor chip and the substrate to be integrated, a through wiring configured to vertically pass through the substrate, a wiring portion configured to electrically connect the semiconductor chip and one side of the through wiring, and an external connection portion to electrically connected to the other side of the through wiring and configured to be able to be electrically connected to an outside, wherein a wiring layer of the wiring portion is provided to be connected to the through wiring.

12 Claims, 13 Drawing Sheets

(51) Int. Cl.
*H01L 23/522* (2006.01)
*H01L 23/538* (2006.01)
*H01L 21/48* (2006.01)
*H01L 23/00* (2006.01)
*H01L 25/10* (2006.01)
*H01L 25/00* (2006.01)
*H01L 23/498* (2006.01)
*H01L 21/56* (2006.01)
*H01L 23/48* (2006.01)

(52) U.S. Cl.
CPC ...... *H01L 23/49827* (2013.01); *H01L 23/522* (2013.01); *H01L 23/5386* (2013.01); *H01L 23/5389* (2013.01); *H01L 24/19* (2013.01); *H01L 25/105* (2013.01); *H01L 25/50* (2013.01); *H01L 21/568* (2013.01); *H01L 23/481* (2013.01); *H01L 23/49816* (2013.01); *H01L 2224/04105* (2013.01); *H01L 2224/12105* (2013.01); *H01L 2224/24227* (2013.01); *H01L 2225/1035* (2013.01); *H01L 2225/1041* (2013.01); *H01L 2225/1058* (2013.01); *H01L 2924/1431* (2013.01); *H01L 2924/1434* (2013.01); *H01L 2924/1436* (2013.01); *H01L 2924/1437* (2013.01); *H01L 2924/15311* (2013.01)

(58) Field of Classification Search
CPC ..... H01L 23/522; H01L 23/528; H01L 23/28; H01L 23/31; H01L 23/3107; H01L 23/3114; H01L 23/3121
See application file for complete search history.

(56) References Cited

U.S. PATENT DOCUMENTS

2009/0168380 A1* 7/2009 Hsu .................... H01L 23/5389
  361/761
2010/0072588 A1* 3/2010 Yang ................. H01L 23/49816
  257/676
2010/0301474 A1* 12/2010 Yang .................. H01L 21/6835
  257/737
2011/0155433 A1* 6/2011 Funaya ............. H01L 23/49827
  174/258

FOREIGN PATENT DOCUMENTS

KR    10-0879191    1/2009
KR    10-1362714    2/2014

OTHER PUBLICATIONS

Notice of Allowance dated Jun. 14, 2016 for Korean Patent Application No. 10-2014-0132544 and its English translation provided by Applicant's foreign counsel.

* cited by examiner

SEMICONDUCTOR PACKAGE AND METHOD OF MANUFACTURING THE SAME

CROSS-REFERENCE TO RELATED APPLICATION

This application claims the benefit of Korean Patent Application No. 10-2014-0132544, filed on Oct. 1, 2015 in the Korean Intellectual Property Office, the disclosure of which is incorporated herein by reference.

BACKGROUND

1. Field

Embodiments of the present invention relates to a semiconductor package and a method of manufacturing the same, and more particularly, to a conductive path provided to electrically connect an upper and lower portion of the semiconductor package.

2. Description of the Related Art

As semiconductor chip manufacturing process have continuously been developed, sizes of semiconductor chip have been reduced. Currently, due to the dramatic reduction in sizes of semiconductor chips, cases in which a package size needs to be increased for an electrical connection when a semiconductor package is formed are occurring. One semiconductor packaging technique that was proposed in this development process is a pan-out package.

Also, many types of techniques in which a pattern structure for vertically transferring a signal is formed at an outer area of the pan-out package, and packages of the same kind or a different kind are vertically stacked to expand a memory capacity or to enhance operation performance of a semiconductor are also being developed.

A pan-out package has an embedded structure in which a semiconductor chip is mounted inside a circuit board, or a structure in which a solder ball is disposed as a final input/output terminal of the semiconductor chip at an outer surface of the semiconductor chip. In general, a via-hole is formed in a substrate to provide a conductive path for electrically connecting upper and lower portions of a semiconductor package, and a metal redistribution layer is formed to electrically connect the via-hole with the semiconductor chip.

In the case of a conventional pan-out package having a via-hole, to connect a pad of the semiconductor chip with the via-hole, a metal pad is formed on an upper surface of the substrate in which the via-hole is formed, and the metal pad is also formed on a lower surface of the substrate to connect an external substrate with the via-hole. Also, a first insulating layer is formed on the metal pad of the upper surface of the substrate, the pad of the semiconductor chip is electrically connected with the via-hole through the metal redistribution layer, and then a second insulating layer is coated thereon.

However, in such a structure, since the metal pad formed on the upper surface of the substrate has a step of a predetermined thickness or more, the first insulating layer should be coated more thickly than the metal pad to uniformly form the first insulating layer. Since the insulating is formed thickly, there is a limit in selecting an insulating material, and fine pitch patterning also faces limitations.

Korean Patent No. 10-1362714 (published on Feb. 13, 2014) discloses a semiconductor package including a through-wire which passes through an insulating substrate, and a manufacturing method thereof.

An embodiment of the present invention relates to a semiconductor package which can be manufactured in a thin type and a method of manufacturing the same.

Further, the embodiment of the present invention relates to a semiconductor package in which a wiring layer can be stacked without an additional metal pad between a through wiring to pass through a substrate and a wiring layer and a method of manufacturing the same.

SUMMARY

A semiconductor package according to an aspect of the present invention includes, a semiconductor chip, a substrate including accommodating portion configured to accommodate the semiconductor chip, and a via hole formed to vertically pass in an outer side of the semiconductor chip, a sealing material configured to mold the semiconductor chip and the substrate to be integrated, a through wiring configured to vertically extend from an inner circumferential surface of the via hole, a through member accommodated inside the through wiring, a wiring portion including a wiring layer configured to electrically connect the semiconductor chip and one side of the through wiring; and an external connection portion electrically connected to the other side of the through wiring and configured to be electrically connectable to the outside.

An end portion of the through wiring is connected to the wiring layer and the end portion may be coplanar with one surface of the substrate.

An end portion of the through wiring is connected to the wiring layer and the end portion may protrude or be recessed from one surface of the substrate in a range of +20 μm to −20 μm, or be coplanar with the one surface.

The wiring portion may be stacked on the semiconductor chip, the substrate, and the sealing material, one surfaces of the semiconductor chip, the substrate, and the sealing material on which the wiring portion is stacked are coplanar with each other. The wiring portion may be stacked on the semiconductor chip, the substrate and the sealing material, and may include a first insulating layer configured to expose a signal pad of the semiconductor chip and the through wiring, a wiring layer provided on the first insulating layer to electrically connect the signal pad and the through wiring, and a second insulating layer provided on the first insulating layer and the wiring layer.

The first insulating layer may include an opening configured to expose the signal pad and the through wiring, and the wiring layer may fill the opening of the first insulating layer to be connected to the signal pad and the through wiring.

The through member may be made of a non-conductive resin.

The through member may be made of a conductive paste.

The through wiring may be made of a plated metal.

The opening of the first insulating layer configured to expose the through wiring may be provided to accommodate an edge of the via hole therein.

A pad portion may be made of a conductive material, one surface of which is attached to the through wiring and the other surface of which is attached to the external connection portion.

An end portion of the through wiring to which the pad portion is attached may protrude from the substrate to extend to the outside.

A metal layer may be interposed between the substrate and the end portion of the through wiring.

A method of manufacturing a semiconductor package according to another aspect of the present invention includes preparing a substrate in which an accommodating portion configured to accommodate a semiconductor chip and a via hole formed to vertically pass in an outer side of the accommodating portion are formed, forming a through wiring in an inner circumferential surface of the via hole in an vertical direction, filling a hollow space of the through wiring with a through member, planarizing one surface of the substrate so that the substrate and one end portion of the through wiring are coplanar with each other, accommodating the semiconductor chip in the accommodating portion, stacking an insulating layer on the semiconductor chip and the substrate, the insulating layer being stacked to expose a signal pad of the semiconductor chip and the through wiring, and forming a wiring layer on the insulating layer to electrically connect the signal pad and the through wiring.

In the forming of the through wiring, the through wiring may enclose an inner circumferential surface of the via hole by performing a deposition or plating process on opposite sides of the substrate.

The through member may be provided by filling of a conductive paste.

The through member may be provided by filling of a non-conductive resin or a non-conductive ink.

After the through member may be filled, stacking a pad portion made of a conductive material on the through member and the through wiring provided on one surface of the substrate may be provided.

An etching process in which a dry film is attached to the pad portion provided on one surface of the substrate and patterning is performed, and the remaining area of the pad portion except a portion to which the dry film is attached and the through wiring is removed may be further included.

Planarizing a surface opposite to a surface in which the pad portion exists by the patterning may be further included, wherein the substrate, the through wiring, and the through member may be coplanar with each other by the planarizing.

A semiconductor package according to still another aspect of the present invention includes a semiconductor chip, a substrate including an accommodating portion configured to accommodate the semiconductor chip, a sealing material configured to mold the semiconductor chip and the substrate to be integrated, a through wiring configured to pass through the substrate in vertical direction, a through member configured to fill a hollow space of the through wiring, a wiring portion configured to electrically connect the semiconductor chip and one side of the through wiring, and an external connection portion electrically connected to the other side of the through wiring and configured to be electrically connectable to the outside, wherein the semiconductor chip, the substrate, and the sealing material are coplanar with each other, the wiring portion is stacked on the semiconductor chip, the substrate, and the sealing member, and includes a first insulating layer configured to expose a signal pad of the semiconductor chip and the through wiring, a wiring layer provided on the first insulating layer to electrically connect the signal pad and the through wiring, and a second insulating layer provided on the first insulating layer and the wiring layer, wherein an end portion of the through wiring connected to the wiring portion is coplanar with the substrate, wherein the wiring layer of the wiring portion includes a first semiconductor package and a second semiconductor package which are provided to be in contact with the through wiring, wherein the first semiconductor package and the second semiconductor package are disposed in lower and upper positions to form a package-on-package, a second insulating layer of the first semiconductor package disposed in a lower position is provided to expose some of the wiring layer, and an external connection portion of the second semiconductor package disposed in the upper position is provided to be electrically connected to a wiring layer of the first semiconductor package.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION

Figure 1:
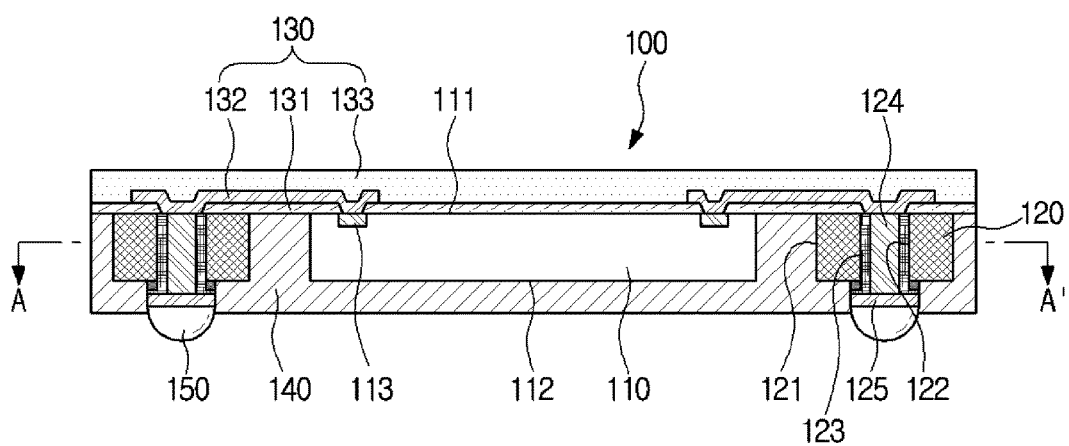
FIG. 1 is a cross-sectional view of a semiconductor package according to an embodiment of the present invention.

Hereinafter, embodiments of the present invention will be described in detail with reference to accompanying drawings. These embodiments described below are provided so that this disclosure will be through and complete, and will fully convey the concept of the invention to those of ordinary skill in the art, and are not intended to be limited to the examples described below. The present invention may be embodied in different forms. Portions not related the description are omitted in the drawings to clearly describe the present invention and, in the drawings, the width, the lengths and thicknesses of layers and regions may be exaggerated for clarity. Like numerals refer to like elements throughout the specification. The "and/or" includes each and all combinations of one or more of the items mentioned.

Figure 2:
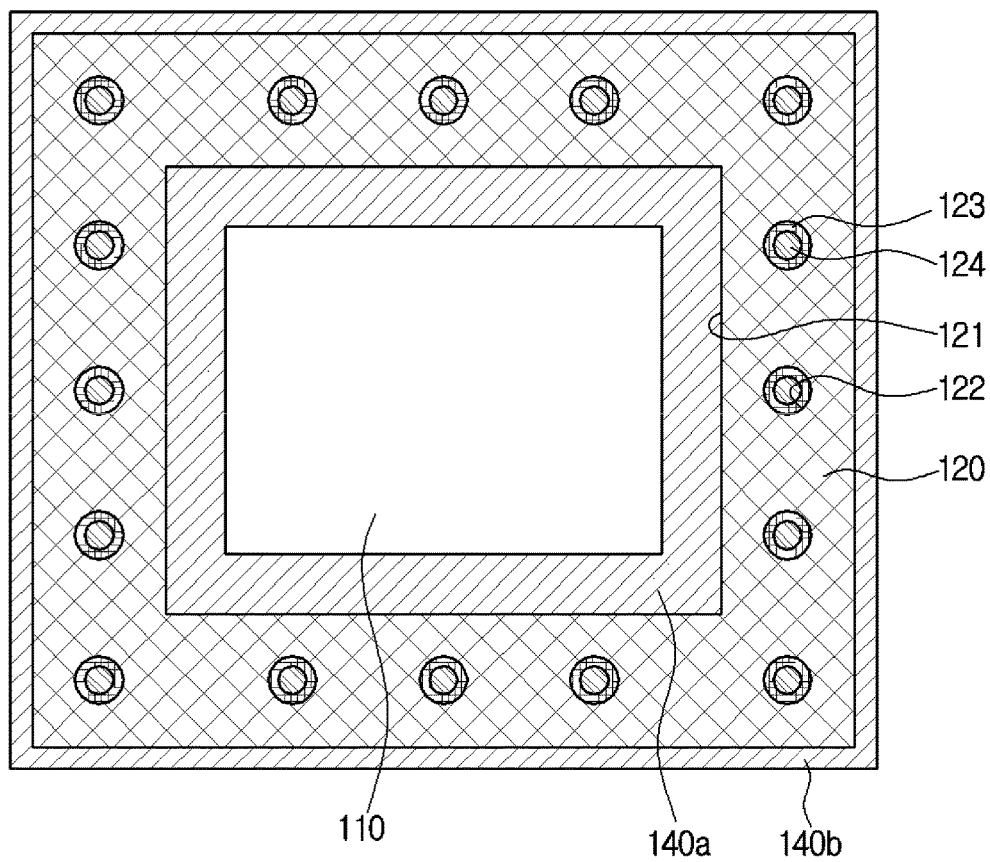
FIG. 2 is a plan view taken along line A-A of the semiconductor package in FIG. 1.
Figure 3:
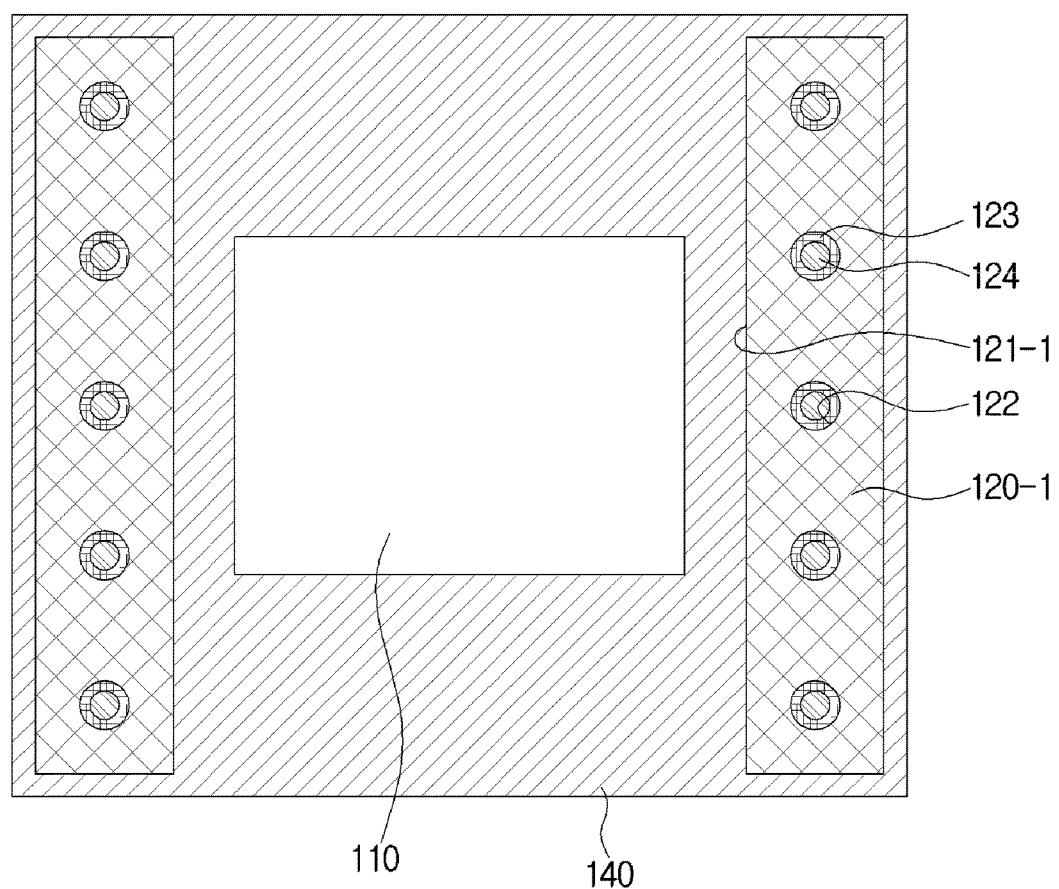
FIG. 3 is a plan view of a substrate according to another embodiment of the present invention.
Figure 4:
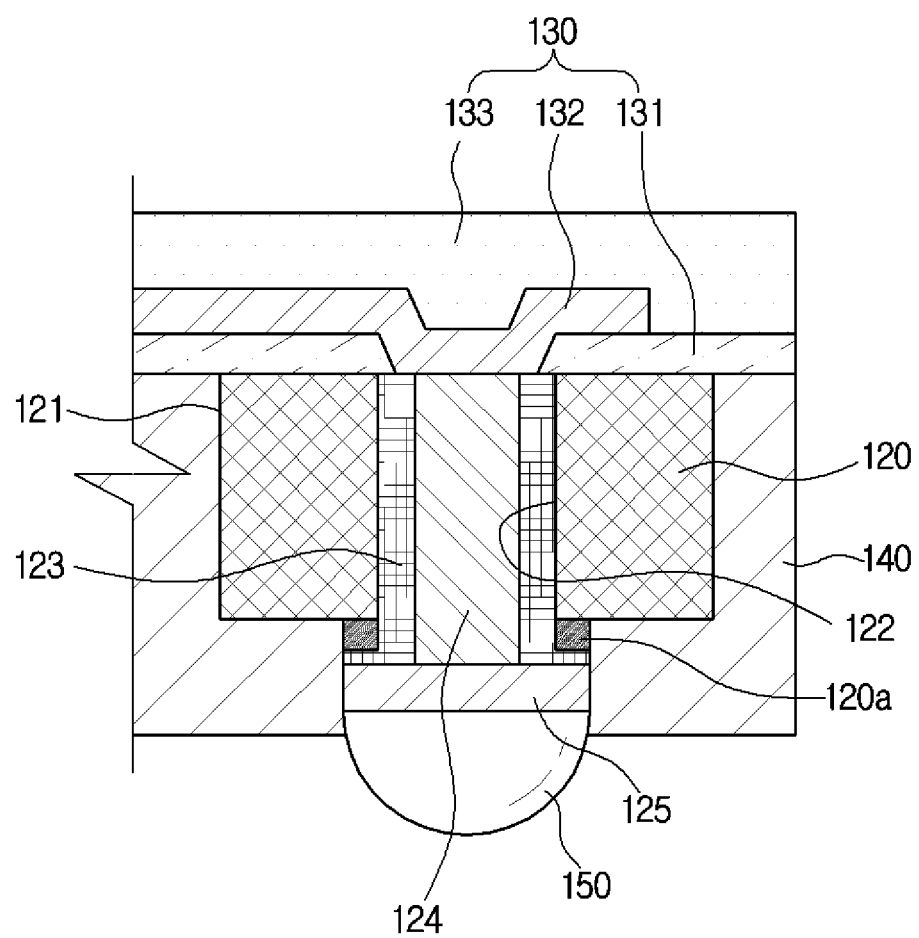
FIG. 4 is an enlarged view illustrating a structure in which a through wiring is coupled with a wiring layer according to a first embodiment of the present invention.

A semiconductor package 100 according to an embodiment of the present invention will be described referring to FIGS. 1 to 4. FIG. 1 is a cross-sectional view of the semiconductor package 100 according to the embodiment of the present invention. FIG. 2 is a plan view taken along line A-A of the semiconductor package 100 in FIG. 1. FIG. 3 is a plan view of illustrating a substrate according to another embodiment of the present invention. FIG. 4 is an enlarged view illustrating a structure in which a through wiring 123 is coupled with a wiring layer 132 according to a first embodiment of the present invention.

The semiconductor package 100 according to the embodiment of the present invention may include a substrate 120, a semiconductor chip 110 accommodated on the substrate 120, a through wiring 123 provided in an outer side of a semiconductor chip 110, a wiring portion 130 which electrically connect the semiconductor chip 110 with the through wiring 123, an external connection portion 150 connected with the through wiring 123 to be connected with an external circuit, and a sealing material 140 which molds the semiconductor chip 110 and the substrate 120.

The substrate 120 may be formed as an insulating substrate. The insulating substrate may include an insulating material such as silicon, glass, a ceramic, a plastic, or a polymer. The substrate 120 may be provided in a plate shape or any of various other shapes such as a circular or polygonal shape.

The substrate 120 may include an accommodating portion 121 to accommodate the semiconductor chip 110. The accommodating portion 121 may be provided to pass through the substrate 120 and positioned in the center of the substrate 120. The accommodating portion 121 may be provided to have a width wider than that of the semiconductor chip 110 to accommodate the semiconductor chip 110. Here, a sealing material 140 which will be described below may be molded between the semiconductor chip 110 and the accommodating portion. Further, though not shown in the drawings, the accommodating portion 121 may be provided to have a groove in which one side is not open. Furthermore, the accommodating portion 121 may be provided to have the same shape in a width direction as the semiconductor chip 110 so that the semiconductor chip 110 is pressed therein.

Referring to FIG. 3, a substrate 120-1 according to another embodiment of the present invention may be disposed in an outer side of the semiconductor chip 110. Further, a plurality of substrates 120-1 may be provided. Although the drawing shows two of the substrates 120-1 disposed on opposite sides of the semiconductor chip 110, four of the substrates 120-1 may be disposed to enclose the semiconductor chip 100.

Here, an accommodating portion 121-1 of the substrate 120-1 may refer to the space to be provided between substrates disposed apart from each other. That is, the semiconductor chip 110 may be disposed in the space between the substrates. Further, the sealing material 140 which will be described below may be molded into the spaces between the substrate 120-1 and the semiconductor chip 110, between substrates, and outer sides of the substrate to be enclosed.

The semiconductor chip 110 may be a memory chip or a logic chip. Examples include a dynamic random-access memory (DRAM), a static random-access memory (SRAM), a flash memory, a phase change random-access memory (PRAM), a resistance random memory (ReRAM), a ferroelectric random access memory (FeRAM), and a megnetoresistive random-access memory (MRAM). As one example, the logic chip may be a controller controlling memory chips.

One side of the semiconductor chip 110 may be an active surface 111 which include an active portion in which circuits are formed. Meanwhile, the other side of the semiconductor chip 110 may be an inactive surface 112. In contrast, both sides of the semiconductor chip 110 may be provided as active surfaces. The active surface 111 of the semiconductor chip 110 may be provided with a plurality of signal pads 113 to exchange a signal with the outside. The signal pads 113 may be formed as a conductive material film such as aluminum (Al). The signal pads 113 may be integrally formed with the semiconductor chip 110.

Although one semiconductor chip 110 is illustrated in FIG. 1, two or more semiconductor chip may be provided in a stacked form. Here, stacked semiconductor chips may be the same kind or a different kind. For example, one semiconductor chip may be a memory chip and the other semiconductor chip may be a logic chip. A semiconductor package in which two or more semiconductor chips are stacked may be a system-on-chip (SOC) or system-in-package (SIP). Further, a plurality of semiconductor chips may be disposed adjacent to each other in a width direction or in contact with each other in a width direction.

It is necessary to have an electrical connection portion electrically connecting the semiconductor package 100 and a main board (not shown) and the like so that the semiconductor chip 110 is mounted on the main board or electrically connected to another chip or package on the main board. Meanwhile, a form of a pan-out package in which circuits expand to an outer side of the semiconductor chip 110 may be provided so that the semiconductor package 100 is mounted on connection portions of the main board which have distances wider than those of the signal pads 113 of the semiconductor chip 110.

Although not shown in the drawings, the main board may include a printed circuit board (PCB) on which circuits are printed or a lead frame. Further, the PCB may include a thin film, glass, or tape.

In order to form a pan-out package, the semiconductor package 100 according to the embodiment of the present invention may include a through wiring 123 which is provided at an outer side than the signal pad 113 in the semiconductor chip 110 to deliver electrical signals up and down. One side of the through wiring 123 may be electrically connected to the semiconductor chip 110 and the other side may be electrically connected to the external connection portion 150. The external connection portion 150 may be electrically connected to the main board, or another chip or package.

The through wiring 123 may be disposed vertically through a via hole 122 provided at the substrate 120 and deliver data signals or power signals between the semiconductor chip 110 and the main board. The via hole 122 is formed to pass through the substrate 120, and a plurality thereof may be provided along an outer side of the accommodating portion 121 in the substrate 120. Referring to FIG. 2, the through wiring 123 is arranged in a line along the outer side of the accommodating portion. In contrast, two or more columns of the through wiring 123 may be provided or the through wiring 123 may be provided on only one side of an accommodating portion 121.

One embodiment of the through wiring 123 is shown in FIG. 4. The through wiring 123 may be a conductive material which is provided along an inner circumferential surface of the via hole 122 and may be a metal layer coated on the via hole 122. The through wiring 123 may be provided in a cylindrical shape and a through member 124 may be accommodated in a hollow space of the through wiring 123.

The through member 124 may be formed to fill up the hollow space of the through wiring 123. The through member 124 may be formed of a non-conductive resin or a non-conductive ink. Further, the through member 124 may be a conductive material, for example, a conductive paste. The conductive paste may include a silver paste.

Meanwhile, the through wiring 123 may be provided as a solder ball and the like to pass through the via hole 122, or may be a solder resist ink which fills up the via hole 122.

A method of forming the through wiring 123 may include electroless plating, electroplating, sputtering, or printing, etc.

One side (an upper side in FIG. 1) of the through wiring 123 may be provided on the same plane as the substrate 120, and the other side (a lower side in FIG. 1) thereof may be provided to protrude from the substrate 120. The other side (or the lower side) protruding from the substrate 120 may be provided to extend outward in a flange shape. The metal layer 120a may be interposed between the substrate 120 and flange portions extending outside. An example of the metal layer 120a may include a copper foil.

One side of the through wiring 123 may be electrically connected to a wiring layer 132 of a wiring portion 130 and the other side thereof may be electrically connected to an external connection portion 150. Meanwhile, a pad portion 125 may be interposed between the through wiring 123 and the external connection portion 150. The pad portion 125 may be provided as a conductive material so that the through wiring 123 may electrically connect to the external connection portion 150 and may firmly adhere the external connection portion 150 to the through wiring 123. A method of forming the pad portion 125 may include electroless plating, electroplating, sputtering, or printing, etc.

The wiring portion 130 may be provided to electrically connect the signal pad 113 of the semiconductor chip 110 and one side of the through wiring 123. For example, the wiring portion 130 may include a first insulating layer 131, a second insulating layer 133 and the wiring layer 132. The first insulating layer 131 and the second insulating layer 133 are provided as an insulating material that insulates the wiring layer 132.

The first insulating layer 131 may be provided to be stacked on one surfaces of the active surface 111 of the semiconductor chip 110, the sealing material 140, and the substrate 120. Further, the first insulating layer 131 may serve as an insulator so that the signal pad 113 of the semiconductor chip 110 and the through wiring 123 which are exposed are connected by the wiring layer 132 stacked on the first insulating layer 131. Meanwhile, when the sealing material 140 is provided to overlap one side of the semiconductor chip 110 and/or the substrate 120, the first insulating layer 131 may not be stacked on the semiconductor chip 110 and/or the substrate 120.

The wiring layer 132 which includes a conductive material may be stacked on the first insulating layer 131 through a relocation process. Since rewiring patterns are formed in the wiring layer 132, input/output terminals of the semiconductor chip 110 may be made fine, a number of input/output terminals may be increased, and the pan-out structure may be enabled. The conductive material may include a metal, for example, copper, a copper alloy, aluminum, or an aluminum alloy.

Meanwhile, the wiring layer 132 may be provided as a premanufactured structure and the structure may adhere to the semiconductor chip 110, the sealing material 140, and the substrate 120 by compression, adhesion, reflow, etc.

The second insulating layer 133 may be provided to be stacked on the first insulating layer 131 and the wiring layer 132 so that the wiring layer 132 is insulated from the outside. Although the second insulating layer 133 seals the wiring layer 132 in the drawing, the second insulating layer 133 may be provided to expose some of the wiring layer 132 and the exposed wiring layer 132 may be electrically connected to the outside (a main board, a semiconductor chip, or a package).

In the semiconductor package 100 according to the embodiment of the present invention, an end portion of the through wiring 123 may not protrude from the substrate 120. Further, the through wiring 123 and the wiring layer 132 may be in direct contact with each other and electrically connected. Here, the meaning of a direct contact includes not only a physical contact and but a contact with a conductive adhesive layer (for example, a seed layer) disposed between targets.

The semiconductor package 100 according to the embodiment of the present invention may not additionally need a metal pad to connect the through wiring 123 with the wiring layer 132. When the metal pad is disposed at an end portion of the through wiring 123, a step difference corresponding to the thickness of the metal pad is generated between one side of the substrate 120 and an upper side of the metal pad, and thereby the restriction that the thickness of the first insulating layer 131 is provided to have a height higher than that of the metal pad occurs. In general, the metal pad which is used to connect interconnections may have a thickness of 50 µm.

As described above, when the metal pad is disposed on an end portion of the through wiring 123, the thickness of the semiconductor package 100 increases, which is contrary to the purpose of pursuing a slim and lightweight product. Further, when an insulating layer is formed to be thick, the restriction occurs in selection of an insulating material and the limitation of fine pitch patterning occurs.

In the semiconductor package 100 according to the embodiment of the present invention, since an additional metal pad is removed and the through wiring 123 and the wiring layer 132 are in direct contact with each other, the manufacturing of a slim and lightweight product may be enabled and the application range of the product may be expanded. For example, the semiconductor package 100 according to the embodiment of the present invention may be used in a sensor apparatus, particularly a fingerprint sensor.

In the case of a sensor apparatus including a fingerprint sensor, minimizing the thickness of a total buildup layer from the active surface 111 of the semiconductor chip 110 is a method of increasing the sensitivity of the sensor. In the semiconductor package 100 according to the embodiment of the present invention, since the thickness of the first insulating layer 131 may decrease, the semiconductor package 100 has high applicability to a fingerprint sensor and the like.

Meanwhile, an upper portion of the through wiring 123 may protrude and be embedded to a lower extent (equal to or less than about 20 µm) than an upper surface of the substrate 120. That is, an upper portion of the through wiring 123 may protrude, may be coplanar, or may be embedded in a range of +20 µm to −20 µm from an upper surface of the substrate. When the through wiring 123 protrudes less than 20 µm from the substrate 120, neither the restriction in selection of an insulating layer material nor the limitation of fine pitch patterning described above occurs.

Meanwhile, even when the through wiring 123 is embedded less than 20 µm from the substrate 120, it is easy for the wiring layer 132 to fill the embedded portion.

An external connection portion 150 may be connected to the other side of the through wiring 123 to be mounted on an external substrate (not shown) and electrically connected to another semiconductor chip or package, etc. The external connection portion 150 may be provided as a solder ball, a solder bump, a conductive ball or the like. The conductive ball may be copper (Cu), gold (Au), nickel (Ni), aluminum (Al), silver (Ag), or an alloy including at least one of these metals.

A sealing material 140 may integrally seal the substrate 120 and the semiconductor chip 110. The sealing material 140 may include an insulating material, for example, an epoxy mold compound (EMC) or an encapsulant. The sealing material 140 may fill between the semiconductor chip 110 and the substrate 120 and may surround the outside of the substrate 120 to protect the substrate 120 from the external environment.

The sealing material 140 may be injected in a fluid state and be hardened in a high temperature environment. For example, a process of simultaneously heating and compressing the sealing material 140 may be included. Here, a vacuum process may be added to remove an inner gas of the sealing material 140. Further, the sealing material 140 may be provided through a method such as coating or printing, and various known techniques in the art may be used as the method of molding the sealing material 140.

One side of the sealing material 140 may be provided to expose one end portions of a signal pad of the semiconductor chip 110, and the through wiring 123. As shown in the drawings, one side of the sealing material 140, the active surface 111 of the semiconductor chip 110 and one side of the substrate 120 are coplanar. A process of planarizing the sealing material 140 may include grinding, sanding, or etching.

Furthermore, the other side of the sealing material 140 may be provided to cover an inactive surface 112 of the semiconductor chip 110 and to firmly and hermetically seal the semiconductor chip 110. Alternatively, according to the required characteristics of the semiconductor package 100, an inactive surface 112 of the semiconductor chip 110 may be provided to be exposed. For example, since one side of the sealing material 140 and the inactive surface 112 of the semiconductor chip 110 are provided to be coplanar, the thickness of the semiconductor package 100 decreases, which is advantageous for heat release of the semiconductor chip 110.

Figure 5:
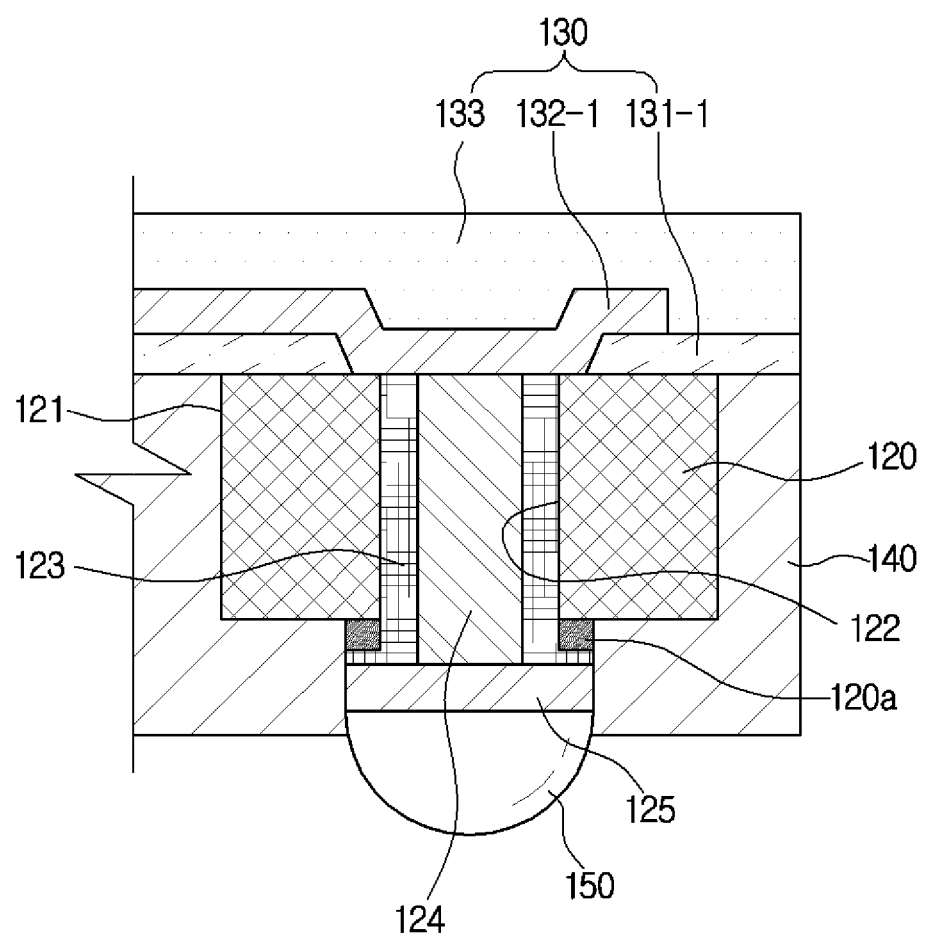
FIG. 5 is an enlarged view illustrating a structure in which a through wiring is coupled with a wiring layer according to a second embodiment of the present invention.

FIG. 5 is an enlarged view illustrating a structure in which a through wiring 123 is coupled with a wiring layer 132-1 according to a second embodiment of the present invention.

Referring to FIG. 5, the first insulating layer 131-1 may be formed to fully expose a through wiring 123. An opening in the first insulating layer 131-1 is provided to connect the wiring layer 132-1 and the through wiring 123. The width of the opening may be provided to be greater than the outer diameter of a via hole 122 of a substrate 120. Since the wiring layer 132-1 fills up the opening of the first insulating layer 131-1 in a process of forming patterns, all end portions of the through wiring 123 are in contact with the wiring layer 132-1. Comparatively referring to FIGS. 4 and 5, the contact areas of the through wiring 123 and the wiring layer 132-1 are different. When the contact area of the through wiring 123 and the wiring layer 132-1 become larger, the reliability of transmitting electrical signals may be enhanced.

Figure 6:
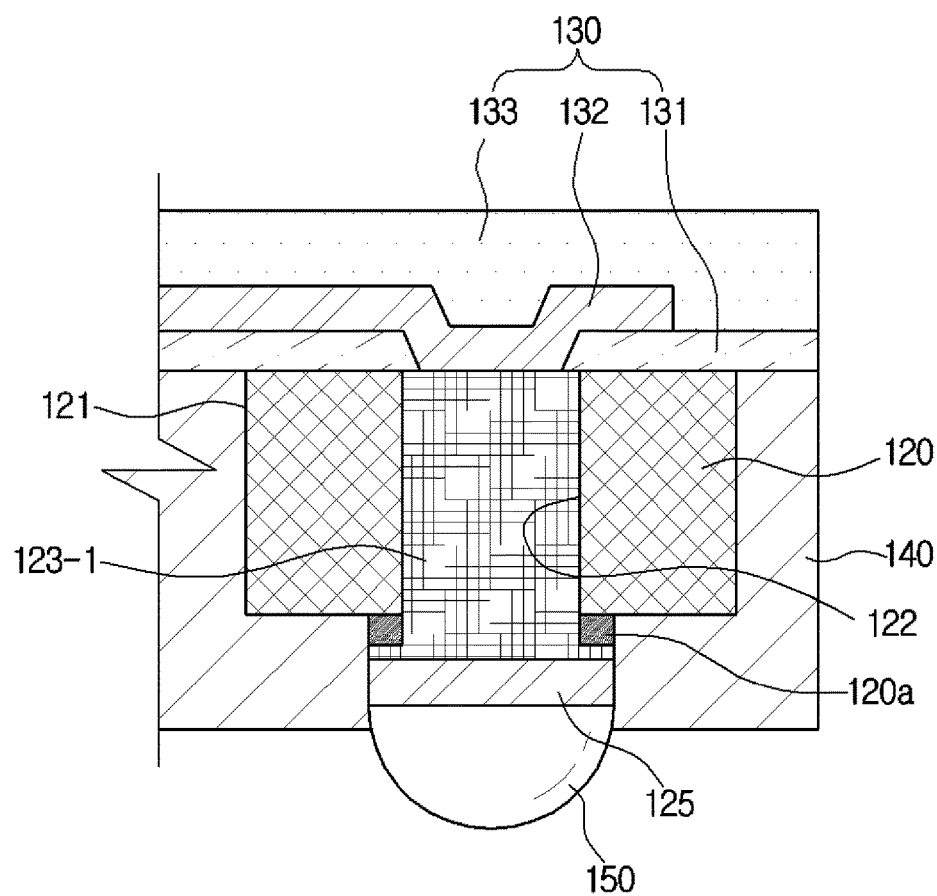
FIG. 6 is an enlarged view illustrating a structure in which a through wiring is coupled with a wiring layer according to a third embodiment of the present invention.

FIG. 6 is an enlarged view illustrating a structure in which a through wiring 123-1 is coupled with a wiring layer 132 according to a third embodiment of the present invention.

Referring to FIG. 6, the through wiring 123-1 may be provided to fill a via hole 122. For example, the through wiring 123-1 may be a conductive paste to fill the via hole 122. By using a conductive paste as the through wiring 123-1 according to the third embodiment of the present invention, the manufacturing cost can be reduced and the manufacturing process can be simplified.

FIGS. 7 to 21 are cross-sectional views illustrating a manufacturing process of the semiconductor package 100 according to the embodiment of the present invention.

Figure 7:
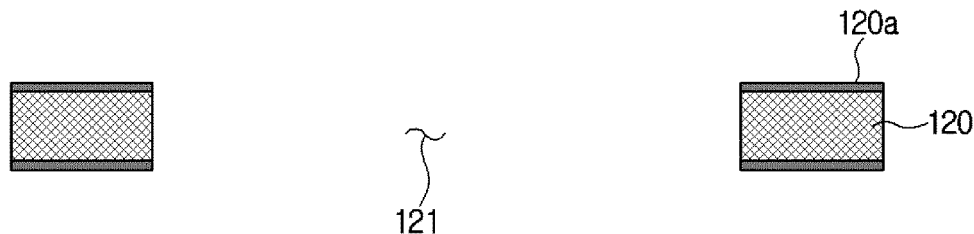
FIGS. 7 to 21 are cross-sectional views illustrating a manufacturing process of a semiconductor package according to an embodiment of the present invention.

FIG. 7 illustrates a process in which a substrate 120 in which an accommodating portion 121 is formed is provided. The substrate 120 may include an insulating material such as silicon, glass, a ceramic, a plastic, or a polymer. The substrate 120 may be provided to have a plate shape or any of various other shapes such as a circular or polygonal shape.

The accommodating portion 121 in which a space is formed to accommodate a semiconductor chip 110 may be provided in a shape corresponding to the semiconductor chip 110. For example, when a rectangular semiconductor chip 110 is accommodated, the shape of the accommodating portion 121 in the width direction may be provided to be a rectangular shape. Further, the accommodating portion 121 may be provided to pass through the substrate 120 or to be a groove shape in which one side is not open.

A metal layer 120*a* may be stacked on opposite sides of the substrate 120. For example, the metal layer 120*a* may be provided as a copper foil.

Figure 8:
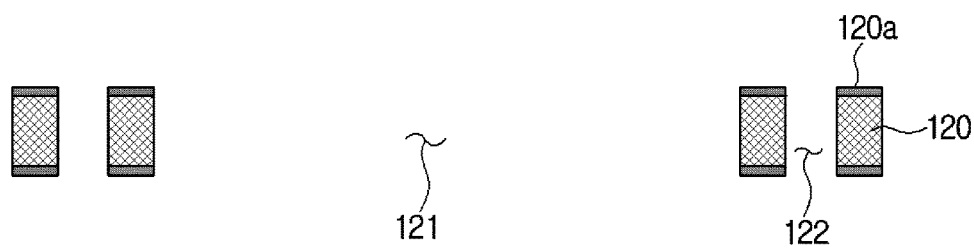

FIG. 8 is a view illustrating a process of forming a via hole 122. The via hole 122 may be provided to pass through the substrate 120 vertically and to be disposed on an outer side of the accommodating portion 121. A cross section of the via hole 122 may be a circular shape or another shape. A plurality of via holes 122 may be provided along the circumference of the accommodating portion 121. Comparatively FIG. 8, two or more of the via holes 122 may pass through the one outer side of the accommodating portion 121.

A process of forming the accommodating portion 121 in FIG. 7 and the via hole 122 in FIG. 8 may be simultaneously performed or either one may precede the other. Further, unlike the drawings, the via hole 122 may be formed before the accommodating portion 121.

A process of forming the accommodating portion 121 and the via hole 122 may be performed using a routing process, a die cutting process, an etching process, a drilling process, a laser ablation process, etc.

Figure 9:
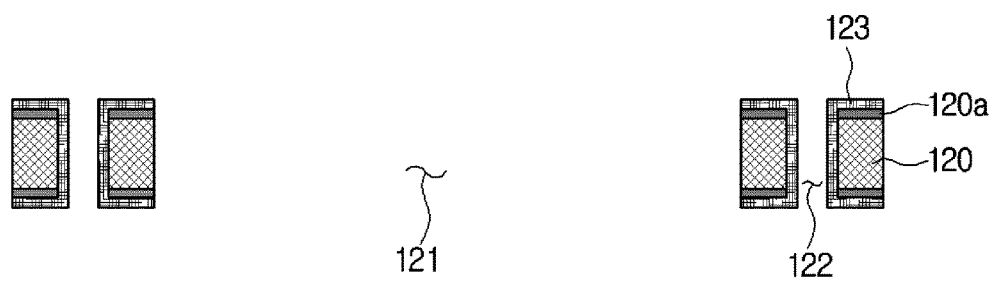

FIG. 9 is a view illustrating a process of forming a through wiring 123 of the via hole 122. The through wiring 123 may be provided as a conductive material including a metal such as copper, a copper alloy, aluminum, or an aluminum alloy. The through wiring 123 may be deposited or filled in the via hole 122 by a process, such as electroless plating, electroplating, sputtering, or printing. For example, the through wiring 123 may be a metal coating layer provided to enclose the inner surface of the via hole 122, and thereby a through hole may be formed inside the via hole 122. As another example, the through wiring 123 may be a conductive paste or a solder resist ink which fills the via hole 122.

Both sides of the through wiring 123 covering both surfaces of the substrate 120 are illustrated in FIG. 9. This is because, when a process, such as plating, sputtering or the like is used, the through wiring 123 may be deposited on exposed surfaces of the substrate 120.

Figure 10:
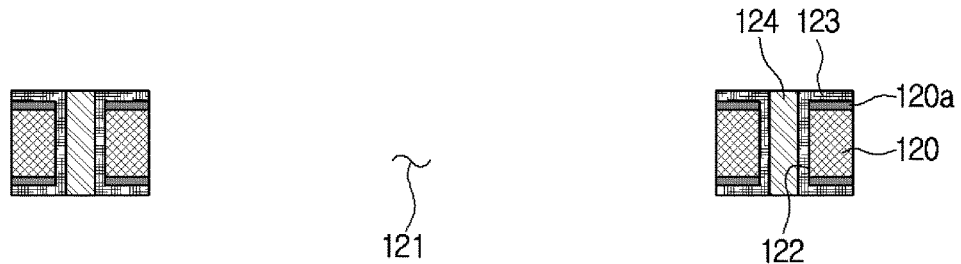

FIG. 10 is a view illustrating a process of filling a through hole of a through wiring 123 with a through member 124. The through member 124 may include a conductive or non-conductive material. When the through member 124 is provided as a conductive material, it may be formed by filling the via hole of the through wiring 123 with a fluid conductive paste and be solidifying it. The conductive paste may be a compound of a metal powder and/or a carbon powder and a liquid resin, and may be provided as copper (Cu) plated with one or more of silver (Ag), solder (SnAg), and gold (Au). Alternatively, the through member 124 may be formed by filling a hollow space of the through wiring 123 with a non-conductive resin. The through member 124 may include a hardening type, a sintering type may be filled using a method by printing, plating, jetting, and the like.

Meanwhile, after the through member 124 is filled, the through wiring 123 and a through member 124 may be formed to be coplanar through a planarization process.

Figure 11:
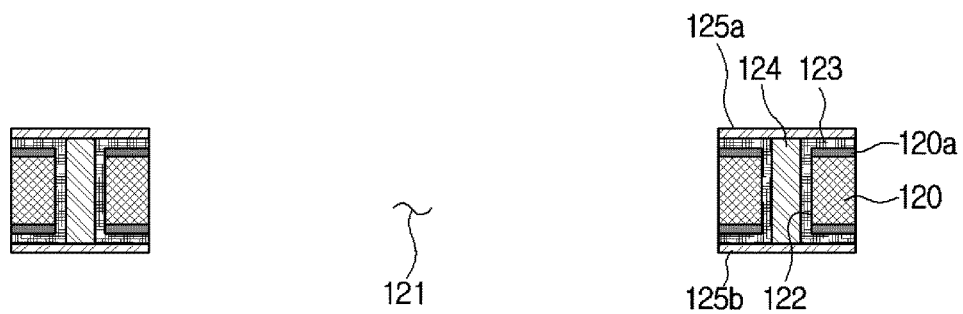

FIG. 11 is a view illustrating a process of forming pad portions 125, 125*a*, 125*b* on opposite sides of the through wiring. The pad portions 125 may include a conductive material, for example, a metal. The pad portions 125 may be provided to improve an electrical contact characteristic between the through wiring 123 and an external connection portion 150, for example, to improve a contact angle or wettability. The pad portions 125 may be stacked on the through wiring 123 and the through member 124 using a process of deposition, electroless plating, electroplating, printing, or the like.

The pad portions 125 may be stacked on the through wiring 123 stacked on opposite sides of the substrate 120 as shown in FIG. 10 and may be stacked on the through wiring 123 which is stacked on any one side of the substrate 120. Meanwhile, a process of forming the pad portions 125 is optional and may be omitted in some cases.

Figure 12:
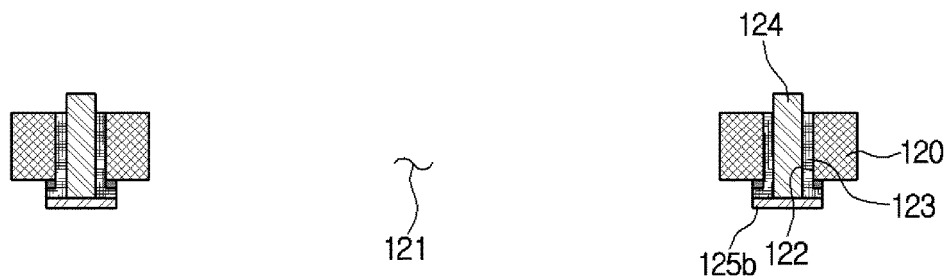

FIG. 12 is a view illustrating a process of removing some of the through wiring 123 and a pad portion 125*a*. The through wiring 123 and a metal layer 120*a* covering the pad portion 125*a* and an upper surface of the substrate 120 may be removed to leave only the through member 124 on the upper surface of the substrate 120. Further, the through wiring 123 and the metal layer 120*a* covering the pad portion 125*b* and an upper surface of the substrate 120 may be removed to leave only a certain area on a lower surface of the substrate 120.

For example, after a dry film (not shown) is attached to only parts of a lower surface of the substrate 120 on which the pad portion 125*b* is to remain and patterned, the pad portion 125*b*, the through wiring 123 and the metal layer 120*a* of the areas to which the dry film is not attached may be removed through a pattern etching process.

Figure 13:
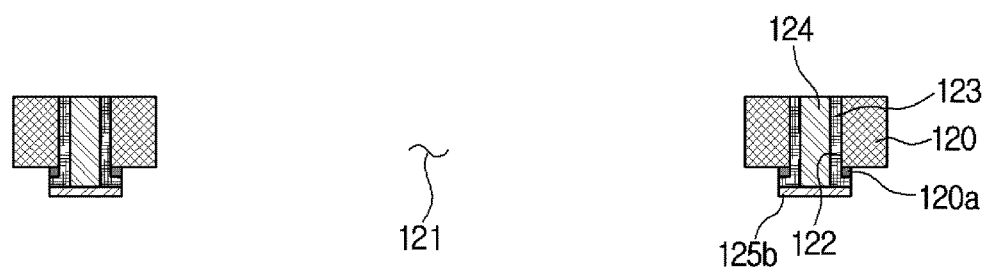

FIG. 13 is a view illustrating a process of planarizing an upper surface of the substrate 120. A planarization process may include grinding, sanding or etching. An upper surface of the substrate 120, the through wiring 123 and the through member 124 may be formed to be coplanar through a planarization process. Unlike FIG. 12, even when some or all residue of the through wiring 123, the metal layer 120*a*, and/or the pad portion 125*b* remains on an upper surface of the substrate 120, it may be removed by a planarization process.

Figure 14:
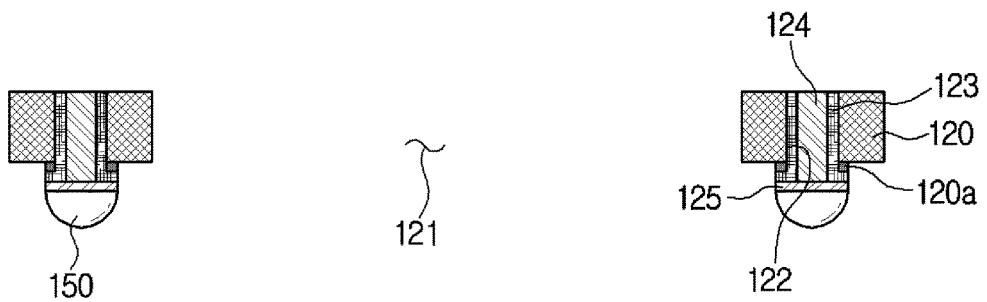

FIG. 14 is a view illustrating a process of attaching the external connection portion 150. The external connection portion 150 may be attached to the pad portion 125 remaining on a lower surface of the substrate 120 and electrically connected to the through wiring 123. The external connection portion 150 may be connected to the through wiring 123 to be mounted on an external substrate (not shown) or electrically connected to another semiconductor chip 110 or another package. The external connection portion 150 may be provided as a solder ball, a solder bump, or a conductive ball. The conductive ball may be copper (Cu), gold (Au), nickel (Ni), aluminum (Al), silver (Ag), or an alloy including at least one of these metals.

Figure 15:
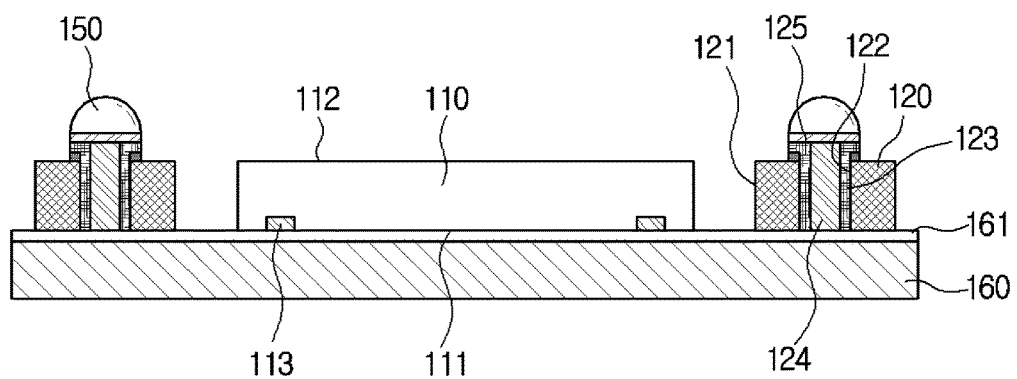

FIG. 15 is a view illustrating a process of attaching the substrate 120 and the semiconductor chip 110 to a first carrier 160. For example, a first adhesive portion 161 may be stacked on an upper surface of the first carrier 160 to fix the substrate 120 and the semiconductor chip 110. The first carrier 160 may include silicon, glass, a ceramic, a plastic, a polymer or the like. The first adhesive portion 161 may be a liquid adhesive or adhesive tape.

A planarized surface (an upper surface of the substrate 120 in FIG. 14) of the substrate 120 may be attached to the first carrier 160 and the external connection portion 150 may be disposed at an upper position. The semiconductor chip 110 may be inserted into the accommodating portion 121 of the substrate 120 and an active surface 111 thereof may be attached to the first carrier 160. In the semiconductor chip 110, the active surface 111 on which a signal pad 113 is formed is attached to the first adhesive portion 161 and an inactive surface 112 is exposed upward.

Meanwhile, the semiconductor chip 110 may be disposed to be separated from inner side surfaces of the accommodating portion 121 in the substrate 120 and to be fixed. That is, a plane area of the accommodating portion 121 may be greater than that of the semiconductor chip 110. Alternatively, side surfaces of the semiconductor chip 110 and inner side surfaces of the accommodating portion 121 in the substrate 120 may be disposed to be in contact with each other. For example, a plane area of the accommodating portion 121 may be almost the same as that of the semiconductor chip 110.

In the drawings, since the thickness of the substrate 120 is equal to that of the semiconductor chip 110, when the substrate 120 and the semiconductor chip 110 are attached to the first carrier 160, one side of the substrate 120 and the inactive surface 112 of the semiconductor chip 110 may have the same height. Meanwhile, the height of the semiconductor chip 110 may be smaller than that of the substrate 120. In this case, an upper surface of the semiconductor chip 110 has a step difference with respect to that of the substrate 120.

Figure 16:
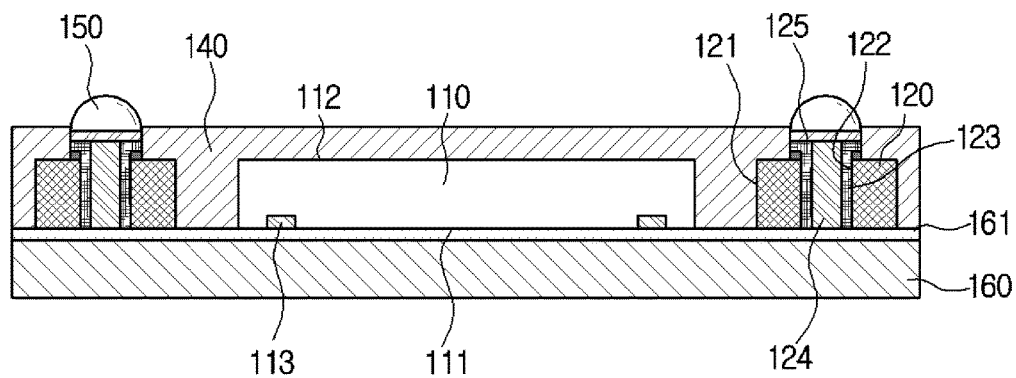

FIG. 16 a view illustrating a process of molding the sealing material. The sealing material 140 may integrally seal the substrate 120 and the semiconductor chip 110. The sealing material 140 may include an insulating material, for example, an EMC or an encapsulant.

The sealing material 140 may fill a space between the semiconductor chip 110 and the substrate 120 may be provided to surround the outer side surface of the substrate 120 to protect the substrate 120 from the external environment. Further, upper surface of the sealing material 140 may be higher than an upper surface of the substrate 120 and the inactive surface 112 of the semiconductor chip 110 and provided to expose an end portion of the external connection portion 150. The sealing material 140 may be formed using a printing method or a compression molding method.

As an example of a method of molding the sealing material 140, a method of hardening may be used to harden the liquid sealing material 140 which is injected into a mold through a thermal process. The liquid sealing material 140 may be injected between an upper mold and a lower mold and fill a space between the semiconductor chip 110 and the substrate 120. A mold for molding the sealing material 140 is omitted in the drawings.

Figure 17:
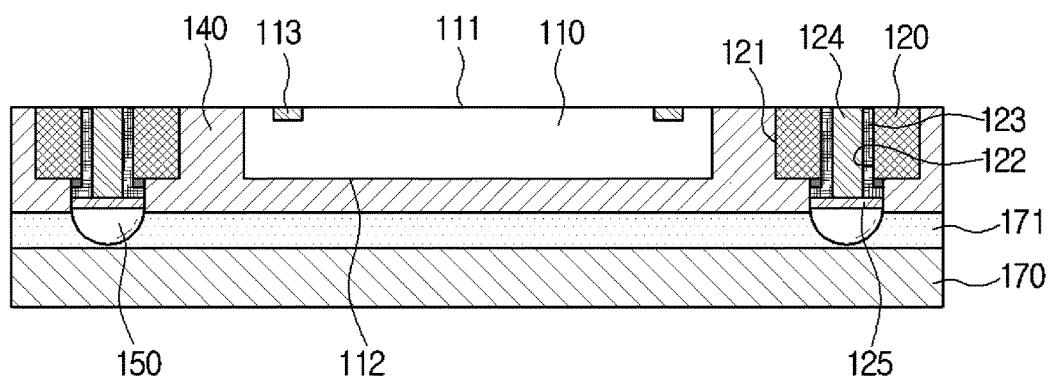

FIG. 17 is a view illustrating a process of removing the first carrier 160 and the first adhesive portion 161, and attaching an upper surface of the sealing material 140 to the second carrier 170. A semi-manufactured package to be integrated by the sealing material 140 may be directed downward toward an external connection portion 150 and fixed to the top of the second carrier 170. For example, the second adhesive portion 171 may be stacked on an upper surface of the second carrier 170 to fix the semi manufactured package to be integrated by the sealing material 140. Meanwhile, the first carrier 160 may be removed, thereby exposing the active surface 111 of the semiconductor chip 110 and the through wiring 123. The second carrier 170 may include an insulating material such as silicon, glass, a ceramic, a plastic, or a polymer. The second adhesive portion 171 may be a liquid adhesive or adhesive tape.

The second adhesive portion 171 may attach one side of the sealing material 140 and accommodate the external connection portion 150 protruding from the sealing material 140. For example, the second adhesive portion 171 may be provided to be elastic.

Figure 18:
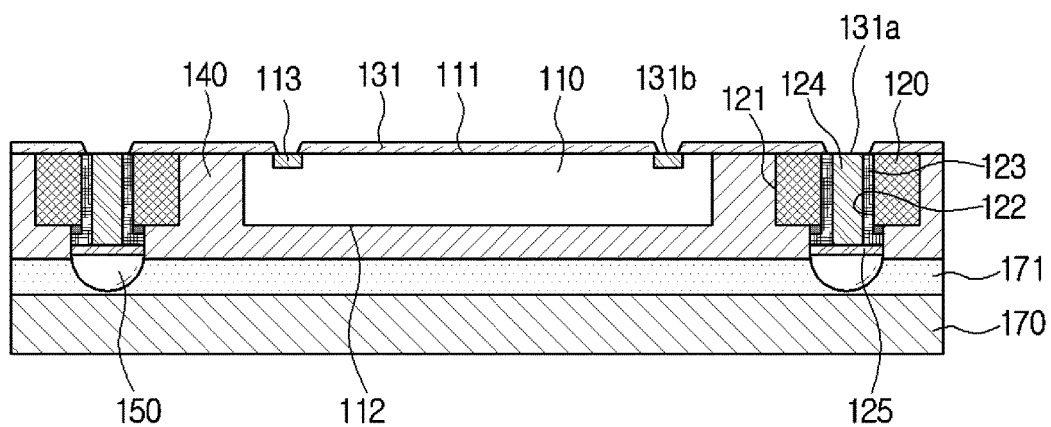

FIG. 18 is a view illustrating a process of forming a first insulating layer 131. The first insulating layer 131 may be stacked to cover the semiconductor chip 110, the substrate 120 and a sealing material 140. Here, the first insulating layer 131 may be provided to expose the through wiring 123 and the signal pad 113. Some of the first insulating layer 131 may be removed using an etching process or a laser ablation process. The first insulating layer 131 may include an insulating material, for example, an oxide, a nitride, an EMC, or the like.

Figure 19:
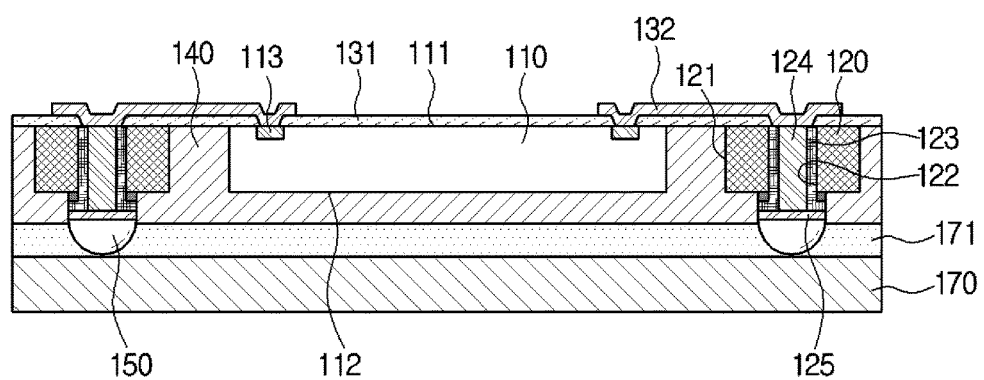

FIG. 19 is a view illustrating a process of forming the wiring layer. The wiring layer 132 may be stacked on the first insulating layer 131 and form rewiring patterns to electrically connect the signal pad 113 and the through wiring 123. The wiring layer 132 may fill openings of the first insulating layer 131 in this process, and connect the signal pad 113 and the through wiring 123.

The wiring layer 132 may include a conductive material, for example, a metal, and may include copper, a copper alloy, aluminum, or an aluminum alloy. The wiring layer 132 may be formed using various methods such as deposition, plating, or printing. Further, the wiring layer 132 may be provided as a premanufactured structure and may adhere to the signal pad 113, the through wiring 123, and/or the sealing material 140 by compression, adhesion, reflow, etc.

Figure 20:
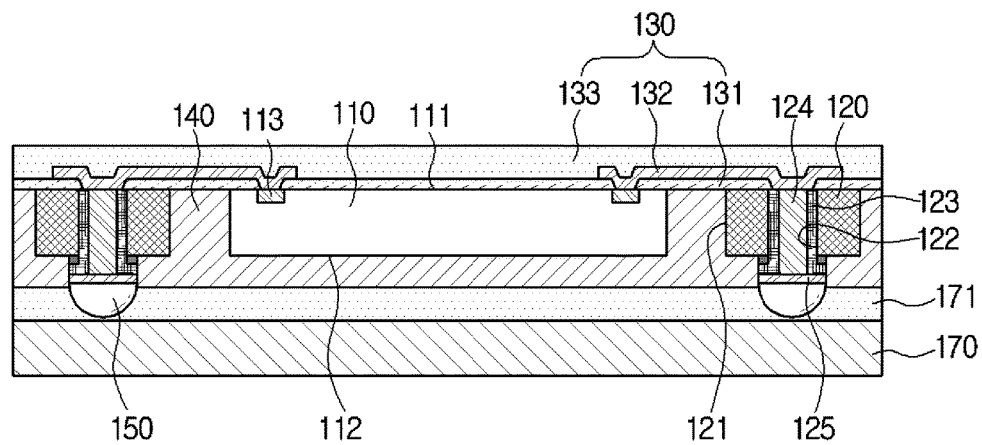

FIG. 20 is a view illustrating a process of forming the second insulating layer 133. The second insulating layer 133 may be stacked to the exposed surfaces of the first insulating layer 131 and the wiring layer 132. In the drawings, the second insulating layer 133 covers the wiring layer 132 preventing exposure to the outside. However, some of the second insulating layer 133 may be removed and the wiring layer 132 may be exposed to the outside. At this time, the exposed portion of the wiring layer 132 may be used as an connection path in which is connected to the out side. The second insulating layer 133 may include an insulating material, for example, an oxide, a nitride, an EMC or the like.

Figure 21:
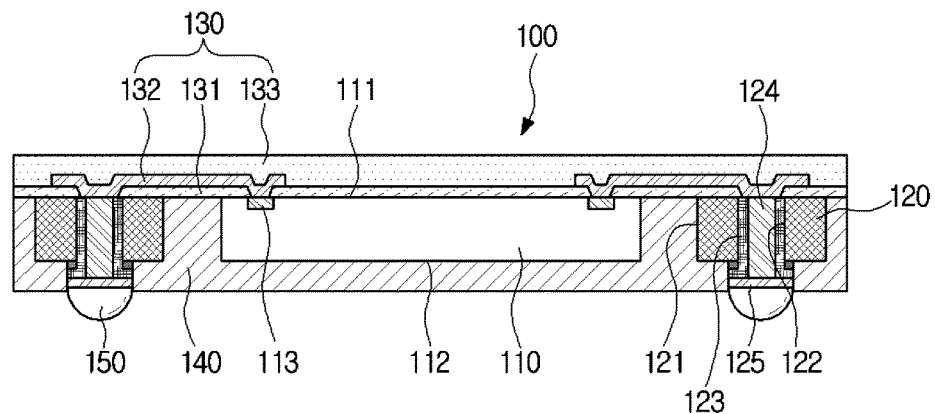

FIG. 21 is a view illustrating a process of providing a semiconductor package 100 according to an embodiment of the present invention after removing the second carrier 170 and the second adhesive portion 171. The external connection portion 150 is exposed by removing the second carrier 170.

Figure 22:
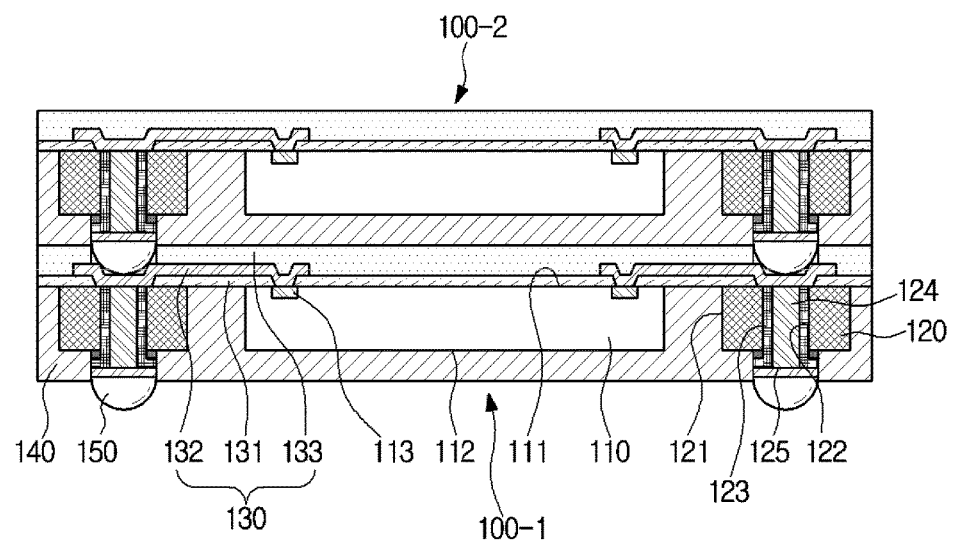
FIG. 22 is a cross-sectional view of package-on-package in which semiconductor packages are stacked in a plurality in FIG. 1.

FIG. 22 is a cross-sectional view of a package-on-package (POP) in which a plurality of semiconductor packages 100 like that shown in FIG. 1 are stacked. The POP may be a stacked structure in which the plurality of semiconductor packages 100-1 and 100-2 are stacked in a vertical direction. Specifically, an upper semiconductor package 100-2 may be disposed on a lower semiconductor package 100-1, a second insulating layer 133 of the lower semiconductor package 100-1 may be provided to expose some of a wiring layer 132, and an external connection portion 150 of the upper semiconductor package 100-2 may be connected to the exposed wiring layer 132 of the lower semiconductor package 100-1.

In a semiconductor package and a method of manufacturing the same according to an embodiment of the present invention, since a thickness of a wiring layer which is disposed between a semiconductor chip and a wiring layer is provided to be thin, a thin type package can be manufactured and a range of selection of an insulating material can be wide. Therefore, an insulating material having a proper reliability can be selected according to requirement of various application products and a fine pitch patterning can be implemented.

Also, the sensitivity of the sensor can increase by minimizing the thickness of a total buildup layer from the active surface of the semiconductor chip While the invention has been described with reference to exemplary embodiments illustrated in accompanying drawings, these should be considered in a descriptive sense only, and it will be understood by those skilled in the art that various alterations and equivalent other embodiment may be made. Therefore, the scope of the invention is defined by the appended claims.

What is claimed is:

1. A semiconductor package comprising:
a semiconductor chip;
a substrate including an accommodating portion configured to accommodate the semiconductor chip and a via hole formed to vertically pass in an outer side of the semiconductor chip;
a sealing material configured to mold the semiconductor chip and the substrate to be integrated;
a through wiring configured to vertically extend from an inner circumferential surface of the via hole;
a through member accommodated inside the through wiring;
a wiring portion including a wiring layer configured to electrically connect the semiconductor chip and one side of the through wiring; and
an external connection portion electrically connected to the other side of the through wiring and configured to be electrically connectable to the outside,
wherein an end portion of the through wiring connected to the wiring layer is coplanar with one surface of the substrate and the through wiring and the wiring layer are in direct contact with each other.

2. The semiconductor package of claim 1, wherein an end portion of the through wiring connected to the wiring layer protrudes or is recessed from one surface of the substrate in a range of +20 μm to −20 μm, or is coplanar with the one surface.

3. The semiconductor package of claim 1, wherein:
the wiring portion is stacked on the semiconductor chip, the substrate, and the sealing material;
one surfaces of the semiconductor chip, the substrate, and the sealing material on which the wiring portion is stacked are coplanar with each other; and
the wiring portion is stacked on the semiconductor chip, the substrate and the sealing material, and includes a first insulating layer configured to expose a signal pad of the semiconductor chip and the through wiring, a wiring layer provided on the first insulating layer to electrically connect the signal pad and the through wiring, and a second insulating layer provided on the first insulating layer and the wiring layer.

4. The semiconductor package of claim 3, wherein the first insulating layer includes an opening configured to expose the signal pad and the through wiring, and the wiring layer fills the opening of the first insulating layer to be connected to the signal pad and the through wiring.

5. The semiconductor package of claim 4, wherein the opening of the first insulating layer configured to expose the through wiring is provided to accommodate an edge of the via hole therein.

6. The semiconductor package of claim 1, wherein the through member is made of a non-conductive resin.

7. The semiconductor package of claim 1, wherein the through member is made of a conductive paste.

8. The semiconductor package of claim 1, wherein the through wiring is made of a plated metal.

9. The semiconductor package of claim 1, further comprising:
   a pad portion made of a conductive material, one surface of which is attached to the through wiring and the other surface of which is attached to the external connection portion.

10. The semiconductor package of claim 9, wherein an end portion of the through wiring to which the pad portion is attached protrudes from the substrate to extend to the outside.

11. The semiconductor package of claim 10, wherein a metal layer is interposed between the substrate and the end portion of the through wiring.

12. A semiconductor package comprising:
   a semiconductor chip;
   a substrate including an accommodating portion configured to accommodate the semiconductor chip;
   a sealing material configured to mold the semiconductor chip and the substrate to be integrated;
   a through wiring configured to pass through the substrate in a vertical direction;
   a through member configured to fill a hollow space of the through wiring;
   a wiring portion configured to electrically connect the semiconductor chip and one side of the through wiring; and
   an external connection portion electrically connected to the other side of the through wiring and configured to be electrically connectable to the outside,
   wherein the semiconductor chip, the substrate, and the sealing material are coplanar with each other;
   the wiring portion is stacked on the semiconductor chip, the substrate, and the sealing member, and includes a first insulating layer configured to expose a signal pad of the semiconductor chip and the through wiring, a wiring layer provided on the first insulating layer to electrically connect the signal pad and the through wiring, and a second insulating layer provided on the first insulating layer and the wiring layer,
   wherein an end portion of the through wiring connected to the wiring portion is coplanar with the substrate and the through wiring and the wiring layer are in direct contact with each other,
   wherein the wiring layer of the wiring portion includes a first semiconductor package and a second semiconductor package which are provided to be in contact with the through wiring,
   wherein the first semiconductor package and the second semiconductor package are disposed in lower and upper positions to form a package-on-package;
   a second insulating layer of the first semiconductor package disposed in the lower position is provided to expose some of the wiring layer; and
   an external connection portion of the second semiconductor package disposed in the upper position is provided to be electrically connected to a wiring layer of the first semiconductor package.

* * * * *